Figure 1:
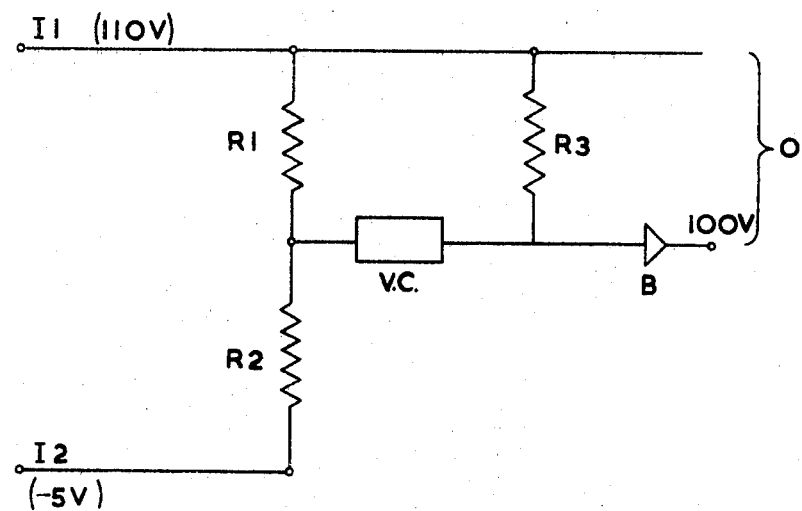

United States Patent [19]

Lewis

[11] 4,085,381

[45] Apr. 18, 1978

[54] AMPLIFIERS

[75] Inventor: John Didwith Lewis, Braintree, England

[73] Assignee: Imperial Chemical Industries Limited, London, England

[21] Appl. No.: 678,427

[22] Filed: Apr. 19, 1976

[30] Foreign Application Priority Data

Apr. 18, 1975 United Kingdom ............... 16082/75

[51] Int. Cl.² .............................................. H03F 3/00
[52] U.S. Cl. ................................. 330/147; 330/124 R; 330/199
[58] Field of Search ............... 330/146, 147, 74, 124 R

[56] References Cited

U.S. PATENT DOCUMENTS

| | | | |
|---|---|---|---|
| 3,259,849 | 7/1966 | Willett et al. | 330/202 |
| 3,701,037 | 10/1972 | Holsinger | 330/124 R |

OTHER PUBLICATIONS

"Handbook of Operational Amplifier Applications", Burr-Brown Research Corporation, 1963, pp. 63-66.

*Primary Examiner*—Lawrence J. Dahl
*Attorney, Agent, or Firm*—Cushman, Darby & Cushman

[57] ABSTRACT

This invention relates to amplifiers for producing an accurate amplified version of a low voltage wave form. Specifically, the amplifier of the invention comprises independently fed first and second resistors connected to a common output which feeds a third resistor via a voltage to current converter, the other end of the third resistor being driven from the same point as the first resistor, the ratio of the resistances of the first and second resistors being made equal to the amplification required so that when the low voltage wave form is fed to the second resistor and a wave form approximating to the required output and of slightly higher voltage is fed to the first and third resistors, the voltage at the common output is proportional to the error in the approximated wave form and the voltage thereby developed across the third resistor by the voltage current converter is approximately equal to the error.

2 Claims, 1 Drawing Figure

AMPLIFIERS

This invention relates to amplifiers.

According to this invention an amplifier for amplifying and inverting a low voltage wave form comprises independently fed first and second resistors connected to a common output which feeds a third resistor via a voltage to current converter, the other end of the third resistor being driven from the same point as the first resistor, the ratio of the resistances of the first and second resistors being made equal to the amplification required so that when the low voltage wave form is fed to the second resistor and a wave form approximating to the required output and of slightly higher voltage is fed to the first and third resistors, the voltage at the common output is proportional to the error in the approximated wave form and the voltage thereby developed across the third resistor by the voltage current converter is approximately equal to the error.

In such an amplifier and where the direction of current flow causes the error voltage to be subtracted from approximated voltage wave form fed to the first resistor, the output of the amplifier which is preferably buffered will be an accurate amplified version of the low voltage wave form.

One circuit of an amplifier in accordance with this invention is shown, by way of example, in FIG. 1 of the accompanying drawings.

In FIG. 1, first and second independently fed resistors are designated R1 and R2 with inputs I1 and I2 respectively. The resistors R1 and R2 are connected to a common output 0 to which a network comprising a voltage to current converter VC and a resistor R3 is connected. As shown in FIG. 1, the resistors R3 to I1 with resistor R1 and the output of the amplifier is buffered at B.

In operation, a known low voltage wave form is fed into the amplifier at I2 and an approximated, voltage wave form is fed into I1. Thus, assuming that the ratio of the resistances R1/R2 is equal to the amplification required and as previously described, the output is an accurate amplified version of the low voltage wave form.

EXAMPLE

Assuming that it is desired to amplify a low input voltage fed into the circuit at input I2 at $-5$ volts by an amplification factor or a gain of 20 and that an approximate voltage of 110 volts is fed into the circuit at I1, then for R1/R2 = 20, the voltage Ve at the common output 0 will be $$Ve = (110 + 5)R_2/R_1 + R_2 - 5 = (115/21) - 5 = (10/21) \text{ volts.}$$

If this voltage is fed to the voltage to current converter VC which, for example, converts volts to milliamps (i.e. 1 volt input results in 1 milliamp out) and R3 is made equal to 21 KΩ, then 10 volts will be developed across R3 which is subtracted from the 110 volts applied to I1 to give the required 100 volts output. This example assumes very accurate resistor matching (i.e. R1:R2 = 20), an accurate voltage to current converter and an accurate resistor R3. The matching of resistors can be carried out to great precision, but an accurate voltage to current converter VC is more difficult to produce. If we, therefore, assume an error in the voltage to converter VC so that 1 volt input provides 1.1mA output (i.e. a 10% error) then the voltage developed across R3 will be 11 volts and this would give 99 volts instead of 100 volts for the final output. However, this represents an overall accuracy of ±1% instead of ±10%, because the voltage to current converter accuracy is reflected in the error voltage rather than the total voltage output.

An amplifier in accordance with this invention is particularly suitable for use in a pattern printing apparatus described and claimed in our earlier British Pat. No. 1,354,890 and our co-pending Patent Application No. 55762/74.

What we claim is:

1. An amplifier for amplifying and inverting a low voltage wave form comprising independently fed first and second resistors connected to a common output which feeds a third resistor via a voltage to current converter, the other end of the third resistor being driven from the same point as the first resistor, the ratio of the resistances of the first and second resistors being made equal to the amplification required so that when the low voltage wave form is fed to the second resistor and a wave form approximating to the required output and of slightly higher voltage is fed to the first and third resistors, the voltage at the common output is proportional to the voltage difference between the wave form approximating to the required output and the voltage thereby developed across the third resistor by the voltage current converter is approximately equal to the error.

2. An amplifier according to claim 1 including a buffer for buffering the output of the amplifier to produce an accurate amplified version of the low voltage wave form.

* * * * *

UNITED STATES PATENT AND TRADEMARK OFFICE
CERTIFICATE OF CORRECTION

PATENT NO. : 4,085,681
DATED : April 25, 1978
INVENTOR(S) : Gerald L. Barber

It is certified that error appears in the above-identified patent and that said Letters Patent are hereby corrected as shown below:

Col. 1, line 61, "to" should be -- of --.

Col. 6, line 66, "16" should be -- 116 --.

Col. 11, line 24, (Claim 12) "clsoing" should be -- closing --.

Signed and Sealed this

Twelfth Day of September 1978

[SEAL]

Attest:

RUTH C. MASON
*Attesting Officer*

DONALD W. BANNER
*Commissioner of Patents and Trademarks*